United States Patent [19]

Yoshimura et al.

[11] Patent Number: 5,308,789
[45] Date of Patent: May 3, 1994

[54] METHOD OF PREPARING DIFFUSED SILICON DEVICE SUBSTRATE

[75] Inventors: Yasushi Yoshimura; Takeshi Akatsuka; Junichi Okada, all of Niigata, Japan

[73] Assignee: Shin-Etsu Handotai Co., Ltd., Tokyo, Japan

[21] Appl. No.: 124,790

[22] Filed: Sep. 22, 1993

[30] Foreign Application Priority Data

Sep. 24, 1992 [JP] Japan .................................. 4-254510

[51] Int. Cl.⁵ .......................................... H01L 21/324
[52] U.S. Cl. ..................................... 437/141; 437/12; 437/248; 437/914; 148/DIG. 126
[58] Field of Search ................ 437/10, 11, 12, 25, 437/74, 75, 76, 77, 138, 141, 914, 946, 949, 952; 148/DIG. 22, DIG. 24, DIG. 60, DIG. 126

[56] References Cited

U.S. PATENT DOCUMENTS

| | | |
|---|---|---|
| 4,314,595 | 2/1982 | Yamamoto et al. ............... 437/247 |
| 4,437,922 | 3/1984 | Bischoff et al. ................... 437/248 |
| 4,459,159 | 7/1984 | O'Mara ............................ 437/247 |
| 4,814,292 | 3/1989 | Sasaki et al. ..................... 437/248 |
| 5,210,056 | 5/1993 | Pong et al. ....................... 437/248 |
| 5,254,484 | 10/1993 | Hefner et al. .................... 437/25 |

Primary Examiner—Brian E. Hearn
Assistant Examiner—Chandra Chaudhari
Attorney, Agent, or Firm—Nikaido, Marmelstein, Murray & Oram

[57] ABSTRACT

In a method of preparing a diffused silicon device substrate for use in the fabrication of a MOS power device, a drive-in diffusion step is followed by a thermal donor formation heat treatment which is achieved by heating the silicon device substrate at a temperature from 400° to 500° C. for 1 to 20 hours and in a gas atmosphere containing oxygen gas, and subsequently a thermal donor formation retarding heat treatment is performed by heating the silicon device substrate at a temperature of from 600° to 700° C. for 8 to 24 hours in a gas atmosphere containing oxygen gas.

2 Claims, 2 Drawing Sheets

METHOD OF PREPARING DIFFUSED SILICON DEVICE SUBSTRATE

BACKGROUND OF THE INVENTION

Field of the Invention

The present invention relates to a method of preparing a diffused silicon device substrate for use in the fabrication of MOS (metal oxide semiconductor) power devices such as power MOSFETs (metal oxide semiconductor field-effect transistors).

Description of the Related Art

Conventionally, high-resistivity silicon device substrates for MOS power devices generally comprise epitaxial silicon device substrates which are composed of a high resistivity silicon epitaxial layer grown on a lower resistivity epitaxial substrate. The epitaxial silicon substrates are, however, very costly to manufacture. This drawback has aroused a desire to substitute diffused silicon device substrates for the uneconomical epitaxial substrates, that being able to be manufactured at a low cost.

FIG. 2 is taken to refer to the cross-sectional structure of an epitaxial silicon device substrate. The illustrated epitaxial silicon device substrate includes a 50 Ωcm resistivity, about 50 μm thick high-resistivity silicon epitaxial layer 10 formed on an approximately 0.01 Ωcm low-resistivity epitaxial substrate 11.

FIG. 3 represents the cross-sectional structure of a diffused silicon device substrate which is to be prepared by the present invention. The diffused silicon device substrate is structurally similar to the epitaxial silicon device substrate shown in FIG. 2 in that it is composed of an impurity diffusion layer 21 and a high-resistivity layer 20 which correspond, respectively, to the low-resistivity epitaxial substrate 11 and the high-resistivity silicon epitaxial layer 10 shown in FIG. 2. The impurity diffusion layer 21 is a portion of a high-resistivity silicon substrate, such as an about 50 Ωcm resistivity FZ (Floating Zone) silicon substrate, which is diffused with an impurity with a high concentration. The high-resistivity layer 20 is the rest of the high-resistivity silicon substrate that is not affected with the impurity diffusion.

In the case where a conventional technique is used to prepare a diffused silicon device substrate for MOS power devices, such as shown in FIG. 3, the resulting substrate has a high-resistivity layer diffused with oxygen with a high concentration. When the diffused silicon device substrate is subjected to device fabrication processes, particularly to a sintering process effected at about 450° C. for sintering the aluminum electrodes, the oxygen (interstitial oxygen) in the high-resistivity layer forms a thermal donor. The thus formed thermal donor changes the resistivity of the high-resistivity layer with the result that the device performance is severely deteriorated.

SUMMARY OF THE INVENTION

It is, therefore, an object of the present invention to provide a method of preparing a diffused silicon device substrate which is capable of retarding or controlling formation of a thermal donor, thereby enabling low-cost fabrication of a MOS power device with high device performance.

More specifically, the invention provides a method of preparing a diffused silicon device substrate for use in the fabrication of a MOS power device, the method comprising the steps of: effecting drive-in diffusion to thereby diffuse an impurity over a silicon device substrate; subsequently performing a thermal donor formation heat treatment by heating the silicon device substrate at a temperature from 400° to 500° C. for 1 to 20 hours and in a gas atmosphere containing oxygen gas; and thereafter effecting a thermal donor formation retarding heat treatment by heating the silicon device substrate at a temperature from 600° to 700° C. for 8 to 24 hours in said gas atmosphere.

Many other objects, advantages and features of the present invention will be better understood from the following description taken in conjunction with the accompanying drawings.

DETAILED DESCRIPTION OF THE INVENTION

Figure 1:
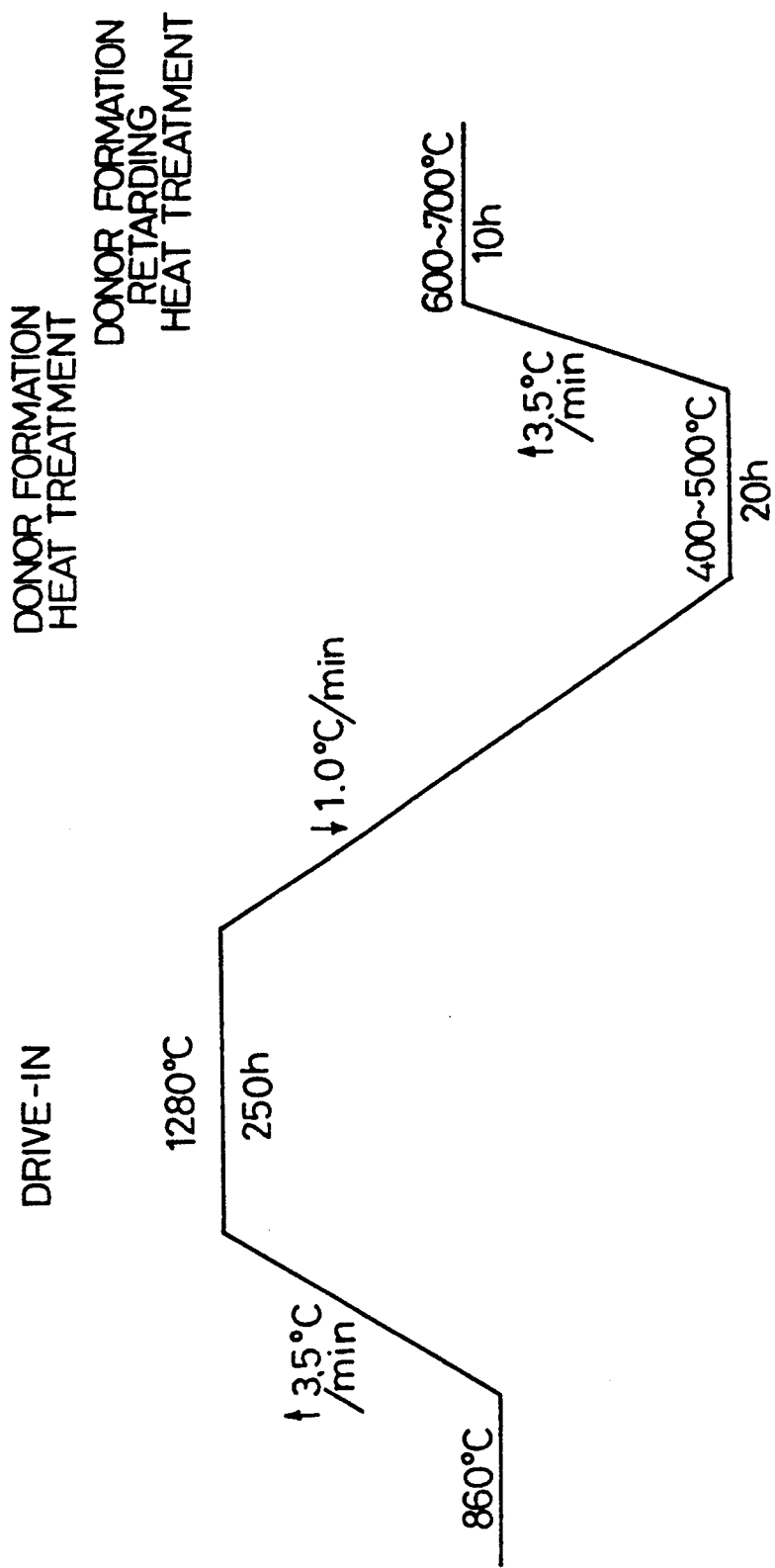
FIG. 1 is a diagrammatical view explanatory of the heat-treating conditions of taken in a method of preparation of a diffused silicon device substrate according to the present invention.
Figure 2:
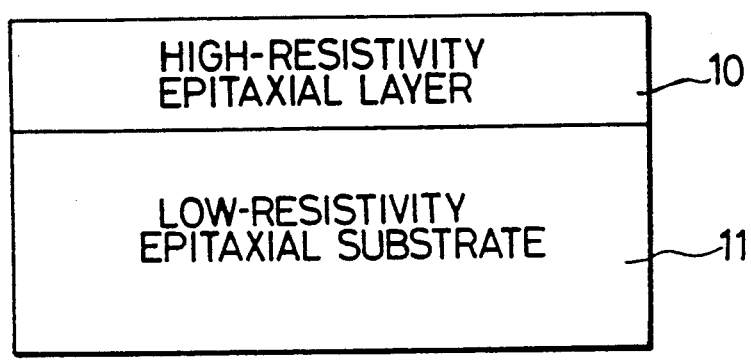
FIG. 2 is a cross-sectional schematic view illustrative of the structure of an epitaxial silicon device substrate.
Figure 3:
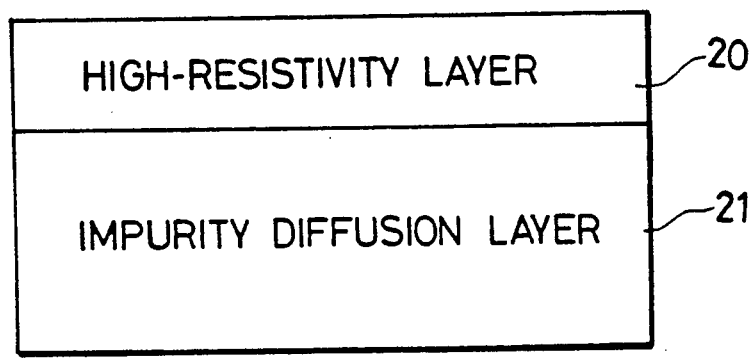
FIG. 3 is a cross-sectional schematic view illustrative of the structure of a diffused silicon device substrate to be prepared by the method of the present invention.

To implement the diffused silicon substrate preparation method according to the present invention, a drive-in diffusion step is effected to obtain a silicon device substrate diffused with an impurity. Then, a thermal donor formation heat treatment is done by heating the silicon device substrate at a temperature of from 400° to 500° C. for 1 to 20 hours. Subsequently, a thermal donor formation retarding heat treatment is performed by further heating the silicon device substrate at a temperature of from 600° to 700° C. for 8 to 24 hours. Each of the heat treatments is carried out in a gas atmosphere containing oxygen gas.

The drive-in diffusion step is performed by using a conventional method. For instance, when a 210 μm thick diffusion layer is to be formed, the drive-in diffusion step is effected at 1280° C. for 250 hours. In the heat treating processes of the present invention, the temperatures and the time periods if below the respective ranges specified above would fail to provide prescribed effects, and the time periods if longer than the values specified above would lower the efficiency of the heat treating processes.

The silicon substrate, when thermally treated in an atmosphere of gas not containing oxygen, forms on its surface an inert passivated film which cannot be properly treated by a subsequent process such as etching. It is, therefore, preferable that the heat treating process of the diffusion silicon substrate is carried out in an atmosphere of gas containing oxygen.

In the course of preparation of a diffused silicon device substrate, impurity diffusion is performed in a gas atmosphere containing oxygen. Accordingly, during the diffusion, particularly a drive-in step thereof effected at a high temperature (1280° C., for example) for a long period of time (250 hours, for example), the oxygen in the atmospheric gas diffuses into the high-resistivity layer of the silicon device substrate.

According to the method of the present invention, the drive-in step of the diffusion process is followed by a first heat treatment which is effected at a temperature from 400° to 500° C. With this heat treatment, the interstitial oxygen, which has been diffused and introduced into the high-resistivity layer at the preceding drive-in step, is grown into Si-O clusters having the property of a donor, with an almost saturated thermal donor concentration. In this condition, the resistivity of n-type silicon is lowered, while the resistivity of p-type silicon is increased or the p-type silicon is changed into n-type silicon.

According to the present invention, the foregoing first heat treatment is followed by a second heat treatment which is effected at a temperature from 600° to 700° C. As a result of the second heat treating process, most of the Si-O clusters previously formed are further grown to such an extent as to form precipitation nucleuses, and the rest of the Si-O clusters is decomposed and degenerated to such an extent to lose the property of a donor. In either case, the Si-O clusters no longer exhibit the property of a donor and they are electrically neutral. In this condition, the resistivity of the high-resistant layer recovers to its original value which is determined by the dopant concentration.

The interstitial oxygen, which has been diffused and introduced during the drive-in step, is thus converted. In this condition, the possibility that the thermal donor formation will happen is very low even when the diffused silicon device substrate is further subjected to a heat treatment which is solely capable of involving thermal donor formation, such as a sintering process effected at around 450° C. for sintering the aluminum electrodes in the device fabrication processes. This may be considered that the precipitation nucleuses are solely unlikely to form a thermal donor and will further grow, by grasping neighboring interstitial oxygen atoms, into a precipitate which is substantially unable to form a thermal donor.

The Si-O clusters which have been decomposed and degenerated according to the method of the invention are almost impossible to form a thermal donor, although only a part of which may form a thermal donor.

As described above, the method of the present invention, when used with the drive-in step performed in a gas atmosphere containing oxygen, is able to prevent the interstitial oxygen from forming a thermal donor in the high-resistivity layer, thereby making it possible to fabricate MOS power devices from a diffused silicon device substrate and not from an epitaxial silicon device substrate.

The term "thermal donor formation heat treatment" is used herein to refer to a heat treatment which is effected at a temperature from 400° to 500° C., and similarly "thermal donor formation retarding heat treatment" a heat treatment effected at a temperature from 600° to 700° C.

The invention will now be described by way of the following examples which should be construed as illustrative rather than restrictive.

EXAMPLES 1-9

Nine diffused silicon device substrates were prepared using silicon substrates of the particulars specified below.

(1) Growth Method: FZ (Floating-zone) method
(2) Diameter: 100 mm
(3) Conductive Type: n-type (doped with phosphorus)
(4) Resistivity: 100 Ωcm
(5) Orientation: (100)
(6) Thickness: 565 μm
(7) Surface Finishing: Etched Finishing Each of the silicon substrate after being deposited with phosphorus according to a known $POCl_3$ method was treated to remove a phosphorus glass layer, followed by a drive-in diffusion step.

As shown in FIG. 1, in the drive-in step, the phosphorus-deposited FZ silicon substrates after being inserted in a diffusion furnace kept at 650° C. were heated to 1280° C. with an increasing rate of 3.5° C./min and thereafter continuously kept at 1280° C. for 250 hours. With this drive-in diffusion, phosphorus diffused over the surface of the silicon substrate reached to a depth of 210 μm.

Subsequently, the temperatures were lowered to 400° C. (for Examples 1-3), 450° C. (for Examples 4-6) and 500° C. (for Examples 7-9), respectively, at the rate of 1° C./min and continued heating for 10 hours, thereby effecting a thermal donor formation heat treatment of the diffused silicon substrates. Then, at the rate of 3.5° C./min the temperature was elevated to 600° C. (for Examples 1, 4 and 7), 650° C. (for Examples 2, 5 and 8) and 700° C. (for Examples 3, 6 and 9) and heating continued at the respective temperatures for 10 hours, thereby performing a thermal donor formation retarding heat treatment.

The drive-in diffusion step, the thermal donor formation heat treatment and the thermal donor formation retarding heat treatment were carried out in a mixed gas atmosphere composed of nitrogen ($N_2$) gas and oxygen ($O_2$) gas in the ratio of 10:3.

After the thermal donor retarding heat treatment, the substrates were lapped on its one side, followed by mirror polishing. Thus, diffused silicon device substrates of 260 μm thick (composed of a 210 μm thick diffused layer and a 50 μm thick high-resistivity layer) were prepared.

The diffused silicon device substrates were subsequently subjected to a simulation heat treatment which is equivalent to gate oxidation and source diffusion processes achieved when the MOSFETs are fabricated. In the simulation heat treating process, the diffused silicon device substrates were heated successively at 1100° C. for 50 minutes, at 1000° C. for 60 minutes, at 1200° C. for 300 minutes and at 1000° C. for 60 minutes and in the $N_2$-$O_2$ mixed gas atmosphere specified above. Thereafter, a further heat treating process (thermal donor formation heat treatment) which is equivalent to a sintering process of the aluminum electrodes was effected at 450° C. for 300 minutes in the same gas atmosphere as specified above.

An oxide film, generated with heat on the surface of the diffused silicon device substrates was removed with hydrofluoric acid after which the resulting substrates were measured for a spreading resistance by the spreading resistance method. The measurements thus obtained were converted into the resistivities of the high-resistivity layers of the respective substrates with the results shown in Table 1.

COMPARATIVE EXAMPLE 1

For comparative purposes, a diffused silicon device substrate was prepared and the resistivity of a high-resistivity layer thereof was obtained by repeating the procedure of Examples 1-9 except that the thermal donor formation heat treating process and the thermal donor formation retarding heat treating process were omitted. The results obtained are also shown in Table 1.

TABLE 1

|  | Thermal donor formation heat treatment | Thermal donor formation retarding heat treatment | Resistivity after simulation heat treatment at 450° C. for 300 minutes |
| --- | --- | --- | --- |
| Comparative Example 1 | Omitted | Omitted | 66 Ωcm |
| Example 1 | 400° C., 10 H | 600° C., 10 H | 97 Ωcm |
| Example 2 |  | 650° C., 10 H | 100 Ωcm |
| Example 3 |  | 700° C., 10 H | 101 Ωcm |
| Example 4 | 450° C., 10 H | 600° C., 10 H | 98 Ωcm |
| Example 5 |  | 650° C., 10 H | 101 Ωcm |
| Example 6 |  | 700° C., 10 H | 100 Ωcm |
| Example 7 | 500° C., 10 H | 600° C., 10 H | 96 Ωcm |
| Example 8 |  | 650° C., 10 H | 99 Ωcm |
| Example 9 |  | 700° C., 10 H | 101 Ωcm |

As appears clear from Table 1, in the case of the diffused silicon device substrates (Examples 1-9) prepared according to the method of the invention, no substantial change is observed in the resistivities of the respective high-resistivity layers even when the diffused silicon device substrates are subjected to a sintering of the aluminum electrodes effected at around 450° C. where the thermal donor formation is likely to occur. It may be considered that Si $_x$ O $_y$ precipitation nucleuses, formed by the thermal donor formation heat treatment and the thermal donor formation retarding heat treatment, grasp the neighboring oxygen atoms during a high temperature heat treatment (such as a gate oxidation process and a source diffusion process) and eventually grow into a precipitate which is substantially unable to form a thermal donor.

In the case of the diffused silicon device substrate (Comparative Example 1) prepared in accordance with the conventional method due to the omission of the thermal donor formation heat treatment and the thermal donor formation retarding heat treatment, the interstitial oxygen contained in the high-resistive layer forms a thermal donor when subjected to a heat treatment at 450° C. As a result of formation of the thermal donor, the resistivity of the high-resistivity layer decreases from 100 Ωcm to 70 Ωcm.

According to the method of the present invention, the interstitial oxygen in the high-resistivity layer is prevented from forming a thermal donor with the result that the resistivity of the high-resistivity layer is kept substantially constant. Since the diffusion silicon device substrate can be prepared less costly than the epitaxial silicon device substrate, a low-cost fabrication of MOS power devices is possible.

What is claimed is:

1. A method of preparing a diffused silicon device substrate for use in the fabrication of a MOS power device, comprising the steps of:
   (a) effecting drive-in diffusion to thereby diffuse an impurity over a silicon device substrate;
   (b) subsequently performing a thermal donor formation heat treatment by heating the silicon device substrate at a temperature from 400° to 500° C. for 1 to 20 hours and in a gas atmosphere containing oxygen gas; and
   (c) thereafter effecting a thermal donor formation retarding heat treatment by heating the silicon device substrate at a temperature from 600° to 700° C. for 8 to 24 hours in a gas atmosphere containing oxygen gas.

2. A method according to claim 1, wherein said gas atmosphere is a mixed gas composed of nitrogen gas and oxygen gas in the ratio of 10:3.

* * * * *